US011578657B2

(12) United States Patent
Muldoon et al.

(10) Patent No.: US 11,578,657 B2
(45) Date of Patent: Feb. 14, 2023

(54) POWER CABLE COOLING SYSTEM IN A GAS TURBINE ENGINE

(71) Applicant: RAYTHEON TECHNOLOGIES CORPORATION, Farmington, CT (US)

(72) Inventors: Marc J. Muldoon, Marlborough, CT (US); Jonathan M. Rheaume, West Hartford, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 124 days.

(21) Appl. No.: 17/081,627

(22) Filed: Oct. 27, 2020

(65) Prior Publication Data
US 2022/0128004 A1    Apr. 28, 2022

(51) Int. Cl.
F02C 7/12      (2006.01)
B64D 33/08     (2006.01)
H05K 7/20      (2006.01)

(52) U.S. Cl.
CPC ........... *F02C 7/12* (2013.01); *H05K 7/20145* (2013.01); *H05K 7/20209* (2013.01); *F05D 2220/323* (2013.01); *F05D 2260/20* (2013.01)

(58) Field of Classification Search
CPC ........... H05K 7/20136; H05K 7/20145; H05K 7/202; H05K 7/20209; F05D 2260/20; F05D 2220/76; B64D 33/08; F02C 7/12; F02C 7/18; F02C 7/32; F01D 25/12; H02K 7/1823; H02K 9/00; H02K 9/02; H02K 9/04
See application file for complete search history.

(56) References Cited

U.S. PATENT DOCUMENTS

| 4,055,041 | A  | 10/1977 | Adamson et al. |
| 5,154,052 | A  | 10/1992 | Giffin, III |
| 5,435,127 | A  | 7/1995  | Luffy et al. |
| 6,895,756 | B2 | 5/2005  | Schmotolocha |

(Continued)

FOREIGN PATENT DOCUMENTS

| EP | 2708701 | 3/2014 |
| EP | 3553295 | 10/2019 |

(Continued)

OTHER PUBLICATIONS

European Patent Office, European Partial Search Report dated Mar. 2, 2021 in Application No. 20184955.1.

(Continued)

*Primary Examiner* — Todd E Manahan
*Assistant Examiner* — Sean V Meiller
(74) *Attorney, Agent, or Firm* — Snell & Wilmer L.L.P.

(57) ABSTRACT

The cooling system may comprise: an electric machine; a first conduit including a cable housing and an inlet; a plurality of conductive cables extending from the electric machine, the plurality of conductive cables disposed at least partially in the cable housing; and an electric fan disposed in the first conduit, the cooling system configured to passively flow air through the first conduit to cool the plurality of conductive cables during operation of the gas turbine engine, and the electric fan configured to actively cool the plurality of conductive cables after an engine shutdown of the gas turbine engine.

18 Claims, 7 Drawing Sheets

(56) References Cited

U.S. PATENT DOCUMENTS

| | | | |
|---|---|---|---|
| 6,931,856 B2 | 8/2005 | Belokon et al. | |
| 7,134,271 B2 | 11/2006 | Baughman | |
| 7,383,685 B2 | 6/2008 | Means | |
| 8,487,500 B2 * | 7/2013 | Cullen | H02K 3/24 |
| | | | 310/216.081 |
| 9,003,811 B2 | 4/2015 | Barnett et al. | |
| 9,097,134 B2 | 8/2015 | Ferch et al. | |
| 9,148,040 B2 | 9/2015 | Anthony | |
| 9,239,029 B2 | 1/2016 | Herrmann | |
| 9,644,538 B2 | 5/2017 | Dionne | |
| 9,879,600 B2 * | 1/2018 | Stovall | F02C 7/12 |
| 9,917,490 B2 | 3/2018 | Lemmers et al. | |
| 9,958,160 B2 | 5/2018 | Dierberger | |
| 10,308,366 B2 | 6/2019 | Kupiszewski et al. | |
| 10,422,282 B2 | 9/2019 | Williams | |
| 11,047,306 B1 * | 6/2021 | Millhaem | F01D 25/24 |
| 2005/0091963 A1 | 5/2005 | Li | |
| 2013/0284420 A1 | 10/2013 | Stovall et al. | |
| 2014/0252769 A1 | 9/2014 | Menheere et al. | |
| 2014/0321981 A1 | 10/2014 | Rodriguez et al. | |
| 2016/0149469 A1 | 5/2016 | Lemmers et al. | |
| 2016/0258358 A1 | 9/2016 | Kazlauskas et al. | |
| 2017/0184025 A1 | 6/2017 | Sawyers-Abbott | |
| 2018/0050806 A1 | 2/2018 | Kupiszewski et al. | |
| 2018/0051701 A1 | 2/2018 | Kupiszewski et al. | |
| 2018/0051702 A1 | 2/2018 | Kupiszewski et al. | |
| 2018/0051716 A1 | 2/2018 | Cheung et al. | |
| 2018/0283197 A1 | 10/2018 | Jackowski et al. | |
| 2019/0085715 A1 | 3/2019 | van der Merwe | |
| 2021/0018008 A1 | 1/2021 | Muldoon | |
| 2021/0108568 A1 * | 4/2021 | Caimano | F01D 25/36 |
| 2021/0324799 A1 * | 10/2021 | Suzuki | H02K 7/18 |
| 2022/0045573 A1 | 2/2022 | Seki | |

FOREIGN PATENT DOCUMENTS

| | | |
|---|---|---|
| GB | 865838 | 4/1961 |
| JP | 2001078344 | 3/2001 |
| JP | 2004076703 | 3/2004 |
| WO | 2021014667 | 1/2021 |

OTHER PUBLICATIONS

United Kingdom Intellectual Property Office, United Kingdom Preliminary Report dated Sep. 1, 2021 in Application No. GB2112187.6.

USPTO, Non-Final Office Action dated Oct. 18, 2021 in U.S. Appl. No. 16/511,135.

USPTO, Restriction/Election Requirement dated Nov. 17, 2021 in U.S. Appl. No. 16/782,650.

USPTO, Restriction/Election Requirement dated Jan. 18, 2022 in U.S. Appl. No. 17/018,795.

United Kingdom Intellectual Property Office, United Kingdom Search Report dated Dec. 23, 2021 in Application No. GB2112187.6.

European Patent Office, European Office Action dated Jan. 4, 2022 in Application No. 21184728.0.

USPTO, Final Office Action dated Mar. 18, 2022 in U.S. Appl. No. 16/511,135.

USPTO, Non-Final Office Action dated Mar. 15, 2022 in U.S. Appl. No. 16/782,650.

USPTO, Non-Final Office Action dated May 10, 2022 in U.S. Appl. No. 17/018,795.

European Patent Office; Extended European Search Report dated Apr. 28, 2022 in Application No. 21184728.0.

USPTO, Advisory Action dated Jun. 3, 2022 in U.S. Appl. No. 16/511,135.

European Patent Office, European Search Report dated Jun. 4, 2021 in Application No. 21154864.9.

USPTO, Non-Final Office Action dated Sep. 8, 2022 in U.S. Appl. No. 16/782,650.

USPTO, Advisory Action dated Sep. 22, 2022 in U.S. Appl. No. 16/782,650.

USPTO, Notice of Allowance dated Nov. 3, 2022 in U.S. Appl. No. 17/018,795.

USPTO, Non-Final Office Action dated Nov. 30, 2022 in U.S. Appl. No. 16/782,650.

* cited by examiner

POWER CABLE COOLING SYSTEM IN A GAS TURBINE ENGINE

GOVERNMENT LICENSE RIGHTS

This invention was made with Government support under Contract 80AFRC19C0015 awarded by the United States NASA. The Government has certain rights in this invention.

FIELD

The present disclosure relates to gas turbine engines, and, more specifically, to cooling systems for conductive cables in gas turbine engines.

BACKGROUND

A turbofan engine typically includes a fan section, a compressor section, a combustor section and a turbine section. Air entering the compressor section is compressed and delivered into the combustion section where it is mixed with fuel and ignited to generate a high-energy exhaust gas flow. The high-energy exhaust gas flow expands through the turbine section to drive the compressor and the fan section.

Electric power for the engine is typically provided by a motor/generator driven through a tower shaft driven by a main engine shaft. Motor/generators and electric motors are typically stand-alone devices that are coupled to an external accessory gearbox. Alternate motor/generator and motor configurations and placements may provide increased engine efficiencies and accommodate increasing demands for electric power.

SUMMARY

A cooling system for a gas turbine engine is disclosed herein. The cooling system may comprise: an electric machine; a first conduit including a cable housing and an inlet; a plurality of conductive cables extending from a point proximal to the electric machine, the plurality of conductive cables disposed at least partially in the cable housing; and an electric fan configured to actively cool the plurality of conductive cables by flowing air through the first conduit, wherein the cooling system is configured to passively flow air through the first conduit to cool the plurality of conductive cables during operation of the gas turbine engine.

In various embodiments, the cooling system may further comprise a second conduit in fluid communication with the first conduit, the second conduit configured to exhaust a cooling flow forward of the electric machine. The cooling system may further comprise a tail cone defining a tail cone cavity, the electric machine disposed in the tail cone. The second conduit may extend from the tail cone to a drain mast of the gas turbine engine. The cooling system may further comprise a bypass air flow path of the gas turbine engine, the bypass air flow path in fluid communication with the first conduit, wherein the electric fan is configured to actively cool the plurality of conductive cables after an engine shutdown of the gas turbine engine. The cooling system may further comprise a temperature sensor disposed in the cable housing, wherein the electric fan is configured to at least one of activate or increase a rotational speed in response to a measured temperature from the temperature sensor exceeding a predetermined temperature threshold. The cooling system may further comprise a tail cone ejector assembly, the tail cone ejector assembly configured to entrain an exhaust cooling flow through an outlet of a tail cone.

A cable cooling system of a gas turbine engine is disclosed herein. The cable cooling system may comprise: a control system; a first sensor configured to communicate with the control system; an electric fan configured to communicate with the control system; and a non-transitory computer readable storage medium in electronic communication with the control system, the non-transitory computer readable storage medium having instructions stored thereon that, in response to execution by the control system cause the control system to perform operations comprising: detecting, by the control system, a shutdown of the gas turbine engine; activating, by the control system, the electric fan to actively flow air through a conduit having a plurality of conductive cables disposed therein.

In various embodiments, the first sensor may comprise a temperature sensor disposed in a cable housing, wherein the cable housing houses the plurality of conductive cables. The operations may further comprise activating, by the control system, the electric fan in response to a measured temperature from the temperature sensor exceeding a predetermined threshold. The cable cooling system may further comprise a second sensor, wherein the operations further comprise determining, by the control system, an engine shutdown of the gas turbine engine in response to a measurement from the second sensor. The second sensor may be a weight-on-wheels sensor. The operations may further comprise determining, by the control system, an engine shutdown of the gas turbine engine in response to a measurement from the first sensor. The first sensor may comprise a weight-on-wheels sensor.

A method of cooling a plurality of conductive cables in electrical communication with an electric machine in a tail cone of a gas turbine engine is disclosed herein. The method may comprise: passively cooling, via a cable cooling system, the plurality of conductive cables during operation of the gas turbine engine; and actively cooling, via the cable cooling system, the plurality of conductive cables in response to at least one of an engine shutdown of the gas turbine engine or a landing event of an aircraft.

In various embodiments, the method may further comprise exhausting a cooling airflow from the cable cooling system forward of the electric machine. The method may further comprise exhausting a cooling airflow from the cable cooling system through a tail cone ejector assembly. Actively cooling the plurality of conductive cables may further comprises activating an electric fan in response to the engine shutdown of the gas turbine engine. Passively cooling the plurality of conductive cables may include receiving a cooling airflow from an inlet in fluid communication with a bypass air flow of the gas turbine engine. The method may further comprise detecting, via the cable cooling system, at least one of an engine shutdown of the gas turbine engine or the landing event of the aircraft.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented.

Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact. Surface cross hatching lines may be used throughout the figures to denote different parts but not necessarily to denote the same or different materials.

Throughout the present disclosure, like reference numbers denote like elements. Accordingly, elements with like element numbering may be shown in the figures, but may not necessarily be repeated herein for the sake of clarity. Surface shading lines and/or cross-hatching may be used throughout the figures to denote different parts but not necessarily to denote the same or different materials.

Aft includes the direction associated with the tail (e.g., the back end) of an aircraft, or generally, to the direction of exhaust of a gas turbine engine. Forward includes the direction associated with the intake (e.g., the front end) of a gas turbine engine.

A first component that is "radially outward" of a second component means that the first component is positioned at a greater distance away from a central longitudinal axis of the gas turbine engine. A first component that is "radially inward" of a second component means that the first component is positioned closer to the engine central longitudinal axis than the second component. The terminology "radially outward" and "radially inward" may also be used relative to references other than the engine central longitudinal axis.

Figure 1A:
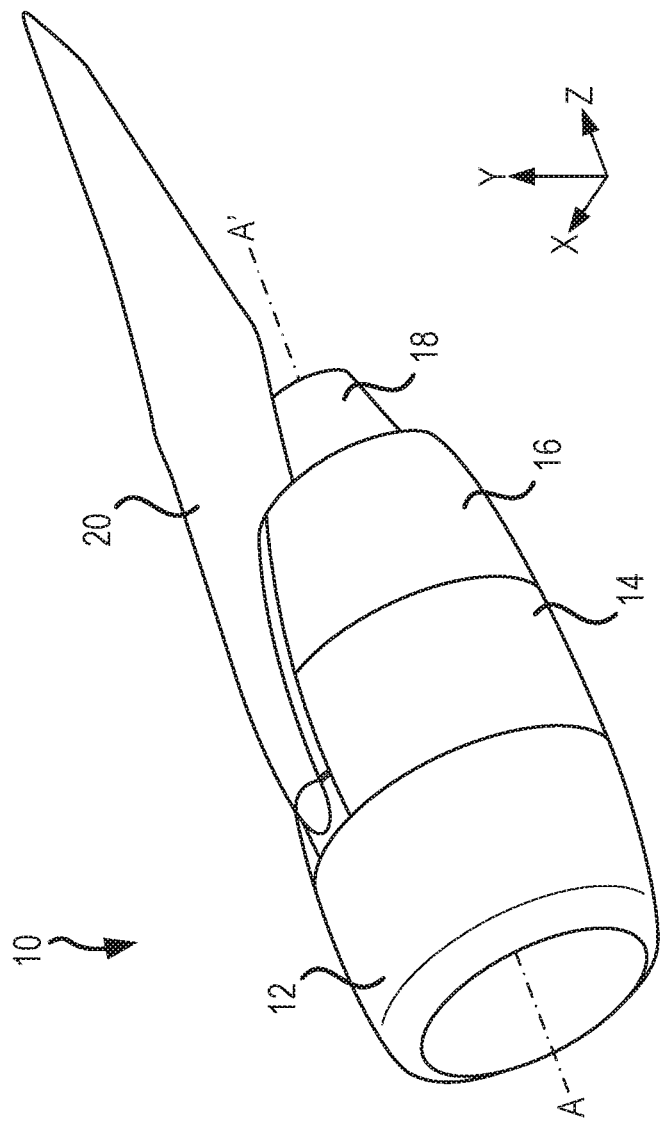
FIG. 1A illustrates a nacelle for a gas turbine engine, in accordance with various embodiments.

With reference to FIG. 1A, a nacelle 10 for a gas turbine engine is illustrated according to various embodiments. Nacelle 10 may comprise an inlet 12, a fan cowl 14, and a thrust reverser 16. Nacelle 10 may be coupled to a pylon 20. Pylon 20 may mount nacelle 10, and a gas turbine engine located within nacelle 10, to an aircraft wing or aircraft body. In various embodiments, an exhaust system 18 may extend from the gas turbine engine mounted within nacelle 10.

Figure 1B:
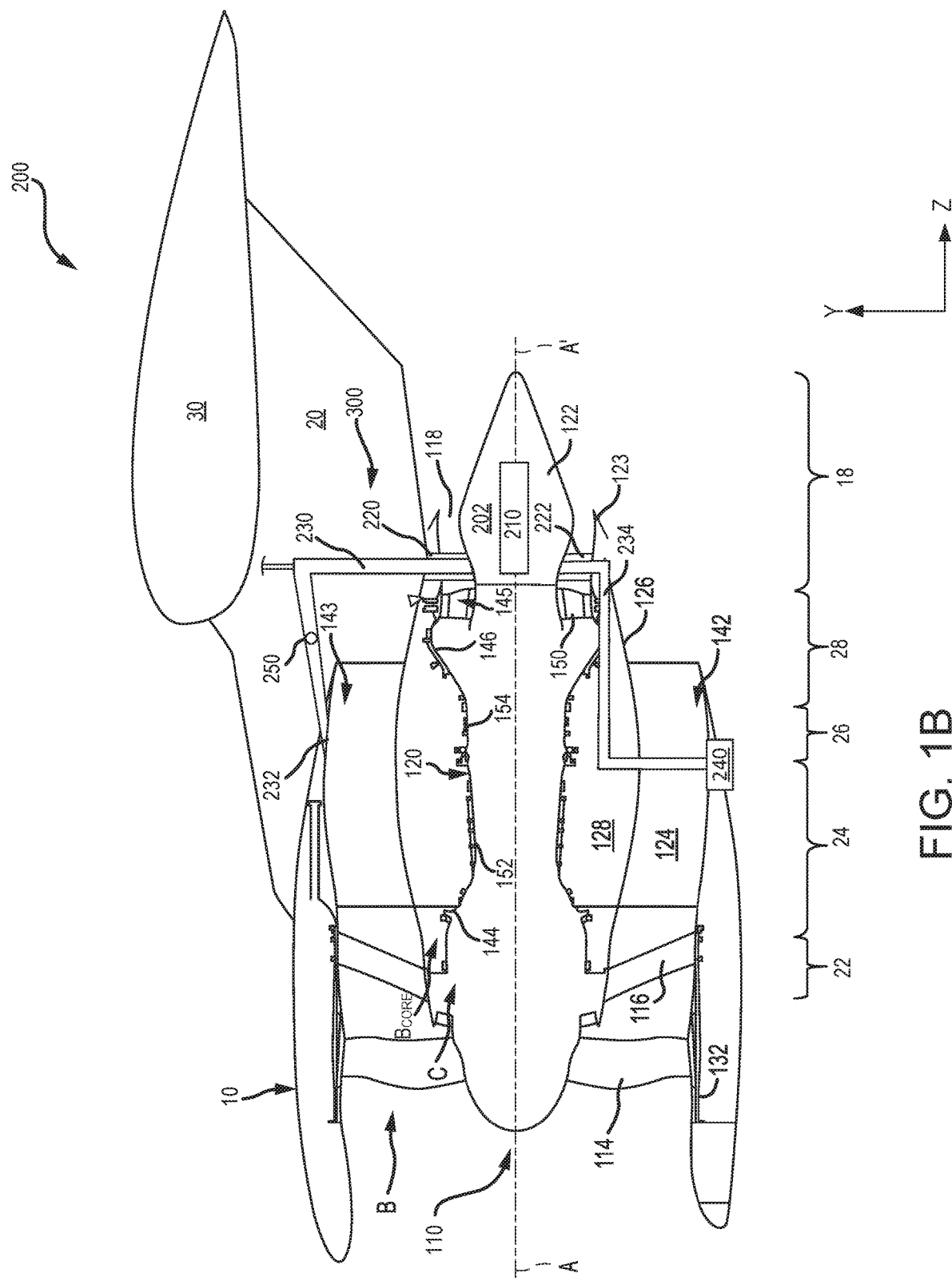
FIG. 1B illustrates a cross-sectional view of a gas turbine engine having a fluid injection system, in accordance with various embodiments.

FIG. 1B illustrates a cross-sectional view of a gas turbine engine 110 located within nacelle 10 and having a cable cooling system 300, in accordance with various embodiments. Gas turbine engine 110 may include a core engine 120. Core engine 120 may include an inlet section 22, a compressor section 24, a combustor section 26, and a turbine section 28. In operation, a fan 114 drives fluid (e.g., air) along a bypass flow-path B while compressor section 24 can drive air along a core flow-path C for compression and communication into combustor section 26 then expansion through turbine section 28. In various embodiments, core engine 120 generally comprises a low speed spool and a high speed spool mounted for rotation about an engine central longitudinal axis A-A'. Low speed spool may generally comprise a shaft that interconnects fan 114, a low pressure compressor 144, and a low pressure turbine 146. The high speed spool may comprise a shaft that interconnects a high pressure compressor 152 and high pressure turbine 154. A combustor may be located between high pressure compressor 152 and high pressure turbine 154. As used herein, a "high pressure" compressor or turbine experiences a higher pressure than a corresponding "low pressure" compressor or turbine. Although depicted gas turbine engine 110 is illustrated as a turbofan engine herein, it should be understood that the concepts described herein are not limited in use to turbofans as the teachings may be applied to other types of engines including turboprop and turboshaft engines. Although core engine 120 may be depicted as a two-spool architecture herein, it should be understood that the concepts described herein are not limited in use to two-spool gas turbine engines as the teachings may be applied to other types of engines including engines having more than or less than two spools.

Core engine 120 drives fan 114 of gas turbine engine 110. The air flow in core flow path C may be compressed by low pressure compressor 144 then high pressure compressor 152, mixed and burned with fuel in the combustor section 26, then expanded through high pressure turbine 154 and low pressure turbine 146. Turbines 146, 154 rotationally drive their respective low speed spool and high speed spool in response to the expansion. Bypass air flow B, driven by fan 114, flows in the aft direction through bypass flow path 124. At least a portion of bypass flow path 124 may be defined by nacelle 10 and an inner fixed structure (IFS) 126.

An upper bifurcation 143 and a lower bifurcation 142 may extend radially between the nacelle 10 and IFS 126 in locations opposite one another. Engine components such as wires and fluids, for example, may be accommodated in upper bifurcation 143 and lower bifurcation 142. IFS 126 surrounds core engine 120 and provides core compartment 128. Various components may be provided in core compartment 128 such as fluid conduits and/or compressed air ducts.

For example, a portion $B_{CORE}$ of bypass air flow B may flow between core engine 120 and IFS 126 in core compartment 128. A fan case 132 may surround fan 114. Fan case 132 may be housed within nacelle 10. Fan case 132 may provide a mounting structure for securing gas turbine engine 110 to pylon 20, with momentary reference to FIG. 1A. According to various embodiments, one or more fan exit guide vanes 116 may extend radially between core engine 120 and fan case 132.

Exhaust system 18 is located aft of turbine section 28. Core air flow C flows through core engine 120 and is expelled through an exhaust outlet 118 of exhaust system 18. Exhaust outlet 118 may comprise an aerodynamic tail cone 122. A primary nozzle 123 may be located radially outward of tail cone 122. Primary nozzle 123 and tail cone 122 may define exhaust outlet 118. Exhaust outlet 118 provides an exhaust path for core air flow C exiting turbine section 28 of core engine 120. A secondary nozzle may be located radially outward of primary nozzle 123. Primary nozzle 123 and the secondary nozzle may define an exit flow path for bypass air flow B exiting core compartment 128 and/or bypass flow path 124. A plurality of turbine exit guide vanes (TEGVs) 150 may be located circumferentially about engine central longitudinal axis A-A' and proximate an aft end 145 of low pressure turbine 146.

In various embodiments, an electric machine 210 is disposed in tail cone 122. The electric machine 210 may be mechanically coupled to a low speed spool in core engine 120. In various embodiments, the electric machine 210 may comprise an electric motor, an electric generator, or a combination thereof. Electric machine 210 may comprise an electric generator, an electric machine, a combination of the two, or the like. Electric machine 210 may be electrically coupled to a juncture box, or any other electrical device known in the art. The electrical device may be disposed radially outward from IFS 126 of gas turbine engine 110 in a wing 30 of an aircraft, in the pylon 20 of the aircraft, or the like. Conductive cables may extend from the electric machine 210 to the electric device external to gas turbine engine 110. The conductive cables (e.g., copper wires or the like) may extend radially outward from electric machine 210 through a strut 220, through the pylon 20 and to an electrical device in the wing 30, or any other location external or internal to IFS 126. The strut 220 extends from the tail cone 122 beyond the IFS 126. The strut may be disposed aft of the aft end 145 of low pressure compressor turbine 146 and forward of exhaust outlet 118. Due to the conductive cables proximity to exhaust outlet 118, the conductive cables may experience relatively high temperatures from air flow in core air flow path C. In various embodiments, a cable cooling system 300 may be configured to cool the conductive cables electrically coupled to the electric machine 210.

In various embodiments, the conductive cables may be disposed in a first conduit 230 extending radially outward from tail cone 122 through strut 220 and into the pylon 20. The first conduit 230 may be fluidly coupled to the bypass air flow path B by any method known in the art, such as a scoop, a vent, or the like. For example, in various embodiments, the first conduit 230 includes an inlet 232 disposed adjacent to the bypass air flow path B. In this regard, bypass air from bypass air flow path B may be diverted to act as a cooling source for cooling of conductive cables. In various embodiments, the cable cooling system 300 includes an electric fan 250 disposed in the first conduit 230. In various embodiments, the electric fan 250 is configured to be powered on in response to gas turbine engine 110 shutting down. In this regard, the cable cooling system 300 is configured to continue cooling the conductive cables after engine shutdown of the gas turbine engine 110.

In various embodiments, the first conduit 230 may be diverted from a takeoff duct in fluid communication with a pre-cooler heat exchanger. The pre-cooler heat exchanger may be configured to cool bleed air extracted from an engine compressor stage by rejecting heat to air flowing from the bypass flow path before the bleed air is sent to a fuselage of an aircraft to run an environmental control system, to pressurize the aircraft, or to generate inert gas for fuel tank inerting as known to those skilled in the art. In various embodiments, the inlet 232 of the first conduit 230 may be upstream of the pre-cooler heat exchanger or downstream of the pre-cooler heat exchanger. In various embodiments, by having the inlet of the first conduit 230 upstream of the pre-cooler heat exchanger, a colder fluid may be provided to the plurality of conductive cables in the first conduit 230 resulting in greater temperature control of the plurality of conductive cables.

In various embodiments, the electric machine 210 is disposed in a tail cone cavity 202 defined by an inner wall of the tail cone 122. In various embodiments, the cable cooling system 300 further comprises an exhaust vent in the apex of the tail cone 122. In various embodiments, the cable cooling system 300 further comprises a second conduit 234 in fluid communication with the tail cone cavity 202. The second conduit 234 may extend from the tail cone 122 to a drain mast 240. The drain mast 240 may be disposed at a bottom end of the nacelle 10. In various embodiments, the drain mast 240 may include outlets of various drainage tubes of a plumbing system for the gas turbine engine 110. In this regard, the drain mast 240 may comprise a plurality of drainage tubes and the second conduit 234, in accordance with various embodiments. In various embodiments, by having a second conduit 234 routed to the drain mast 240, existing architecture may be utilized to route the exhaust cooling flow of the cable cooling system 300. In various embodiments, the second conduit 234 may be routed through a second strut 222 extending from the tail cone 122 to the drain mast 240. In various embodiments, the second conduit 234 may be routed through a second strut 222 extending from the tail cone 122 to an exhaust vent located in the pylon 20 or to the nacelle 10.

Figure 2:
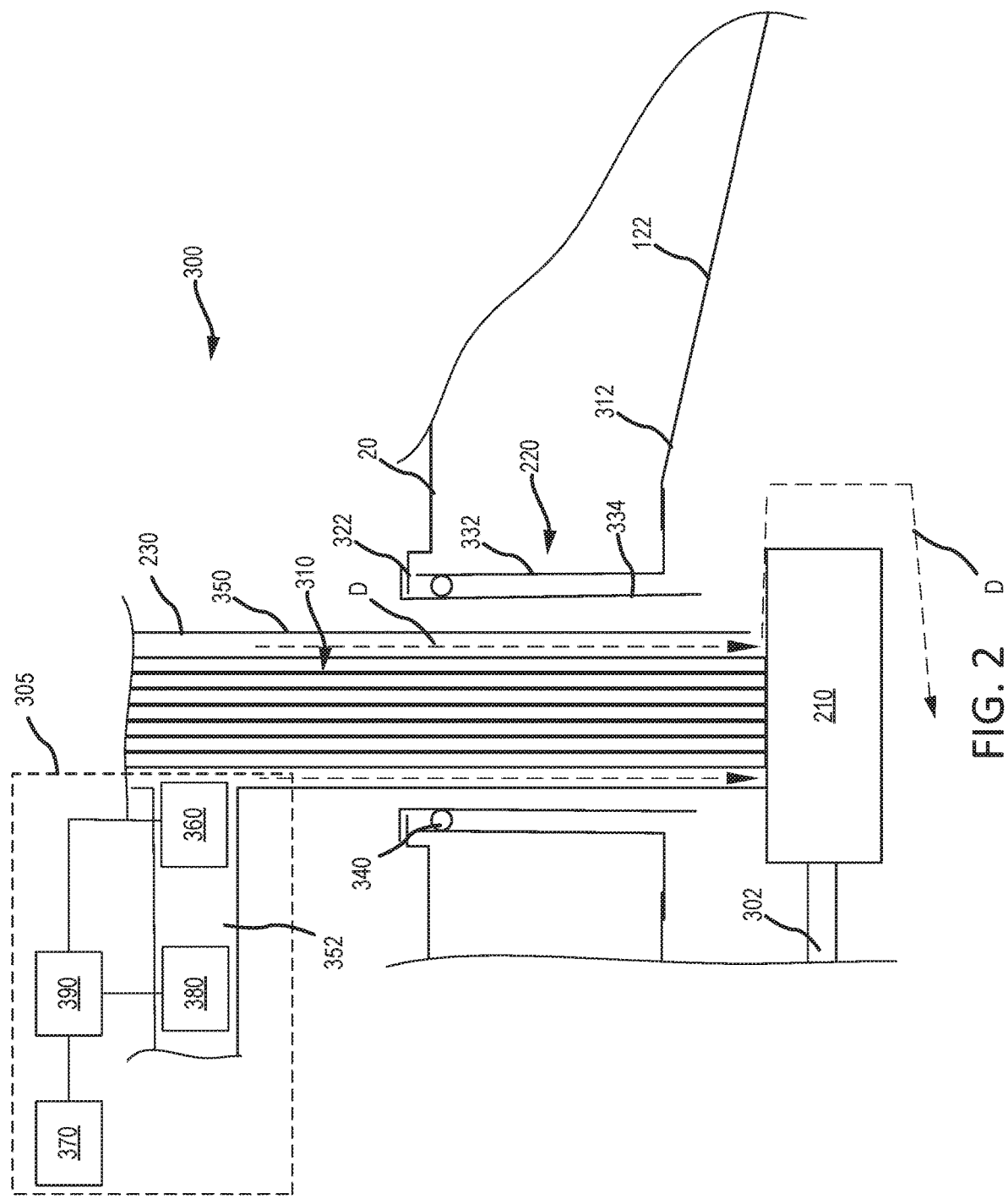
FIG. 2 illustrates a schematic view of cooling system of a gas turbine engine, in accordance with various embodiments.

Referring now to FIG. 2, a schematic view of the cable cooling system 300, in accordance with various embodiments, is illustrated. The cable cooling system 300 comprises a plurality of conductive cables 310. In various embodiments, the conductive cables 310 are extending from an electric machine 210 disposed in a tail cone 122. In various embodiments, the conductive cables 310 extend from a point proximal the electric machine 210 (e.g., via a junction box, or the like). The electric machine 210 is operably coupled to a low speed spool 302 of a gas turbine engine (e.g., gas turbine engine 110 from FIG. 1B). The cable cooling system 300 further comprises a strut 220 extending from a radially outer surface 312 of tail cone 122 to a radially inner surface 322 of pylon 20. The strut 220 may comprise an outer strut shell 332 and an inner strut shell 334. The outer strut shell 332 may be exposed to air flow from core air flow path C in FIG. 1B during operation of the gas turbine engine 110. The cable cooling system 300 may further comprise an air seal 340 disposed between inner strut shell 334 and outer strut shell 332. In this regard, the air seal 340 may ensure that the plurality of conductive cables 310 are sealed from air from core air flow path C.

In various embodiments, the cable cooling system 300 further comprises the first conduit 230. The first conduit 230 may include a cable housing 350 configured to house the plurality of conductive cables 310. The cable housing 350 may be flexible or rigid. The cable housing 350 may comprise a woven fiberglass sleeve, or the like. The cable housing 350 may protect the plurality of conductive cables 310 from contacting strut 220 during operation of the gas turbine engine 110 from FIG. 1. The cable housing 350 may further provide a cooling passageway for cooling air to flow from the inlet 232 from FIG. 1B.

In various embodiments, the first conduit 230 further comprises an inlet conduit 352 in fluid communication with the inlet 232 from FIG. 1B. In various embodiments, the cable cooling system 300 further comprises an electric fan 360 disposed in the inlet conduit 352. The electric fan 360 may be configured to actively cool the plurality of conductive cables 310 when the gas turbine engine 110 from FIG. 1B is shut down. In various embodiments, when gas turbine engine 110 from FIG. 1B is in operation, the electric fan 360 may be turned off (e.g., cooling airflow from bypass flow path B from FIG. 1B may passively cool the plurality of conductive cables 310. In various embodiments, after gas turbine engine 110 is shut down, the electric fan 360 may be turned on to actively cool the plurality of conductive cables 310. In this regard, overheating of the plurality of conductive cables 310 after an engine shut down event may be prevented, in accordance with various embodiments.

In various embodiments, the cable cooling system 300 further comprises a first sensor 370. The first sensor 370 may be any sensor that measures a variable of the gas-turbine engine 110 from FIG. 1B, which can be utilized to determine that the gas-turbine engine 110 is shut down, or an aircraft has landed. For example, the first sensor 370 may comprise a weight-on-wheels (WOW) sensor, a pressure sensor, a temperature sensor, a speed sensor, or the like.

In various embodiments, the cable cooling system 300 comprises a control system 305. The control system 305 comprises a processor 390, at least one sensor (e.g., first sensor 370 and/or second sensor 380) and the electric fan 360. The electric fan 360 may be electrically coupled to a processor 390. In various embodiments, processor 390 may be in operable communication with electric fan 360. In this regard, the processor 390 may be configured to activate the electric fan in response to the aircraft landing and/or in response an engine shut down of the gas turbine engine 110 from FIG. 1B. In response to the engine shutdown or the aircraft landing, processor 390 the electric fan 360 to activate and begin rotating. In various embodiments, the electric fan 360 may be configured to actively cool the plurality of conductive cables 310 for a predetermined period of time measured from the engine shutdown event or the aircraft landing event.

In various embodiments, the cable cooling system 300 may further comprise a second sensor 380 disposed within the first conduit 230. Although illustrated as being disposed in the inlet conduit 352, the present disclosure is not limited in this regard (e.g., the inlet conduit may be disposed in the cable housing 350). In various embodiments, the cable cooling system 300 may be configured to maintain a predetermined temperature in the first conduit after an engine shutdown or aircraft landing event. For example, the second sensor 380 may comprise a temperature sensor configured to measure a temperature in the first conduit 230. In various embodiments, when the temperature in the first conduit 230 exceeds a threshold temperature, the processor 390 may instruct the electric fan 360 to increase a rotational speed.

In various embodiments, the first sensor 370 and the second sensor 380 may be used alone, or in combination. For example, in various embodiments where the first sensor 370 and the second sensor 380 are used, the first sensor 370 may provide an indication that the aircraft has landed or the engine has shutdown, the electric fan 360 may be activated in response, and a speed of the electric fan may be increased if the second sensor 380 measures a temperature above a threshold temperature. In various embodiments where only the first sensor 370 is used, the processor may activate the electric fan 360 for a predetermined period of time in response to detecting a landing event or an engine shutdown event. In various embodiments where only the second sensor 380 is used, the electric fan 360 may be activated in response to the temperature in the first conduit 230 exceeding a predetermined temperature. In various embodiments, the predetermined temperature may be an indication that the gas turbine engine 110 from FIG. 1B has been shut down recently.

In various embodiments, processor 390 may be integrated into computer systems onboard an aircraft, such as, for example, a full authority digital engine control (FADEC), an engine-indicating and crew-alerting system (EICAS), and/or the like. Processor 390 may include one or more processors and/or one or more tangible, non-transitory memories and be capable of implementing logic. Each processor can be a general purpose processor, a digital signal processor (DSP), an application specific integrated circuit (ASIC), a field programmable gate array (FPGA) or other programmable logic device, discrete gate or transistor logic, discrete hardware components, or any combination thereof.

In various embodiments, processor 390 may comprise a processor configured to implement various logical operations in response to execution of instructions, for example, instructions stored on a non-transitory, tangible, computer-readable medium. As used herein, the term "non-transitory" is to be understood to remove only propagating transitory signals per se from the claim scope and does not relinquish rights to all standard computer-readable media that are not only propagating transitory signals per se.

In various embodiments, processor 390 may be configured to control cable cooling system 300. For example, processor 390 may be configured to transfer a control signal to electric fan to actively control cooling of the plurality of conductive cables 310. Processor 390 may generate and transmit the control signal based on an input received from FADEC or an electronic engine control in response to gas turbine engine shutting down. In this regard, cable cooling system 300 may allow for active cooling of the plurality of conductive cables 310 after engine shutdown. The excitation control signal may further comprise electronic instructions configured to cause the electric fan 360 to rotate and provide cooling air in response to a temperature in cable housing 350 exceeding a predetermined threshold. For example, a temperature sensor (e.g. second sensor 380) may be disposed in cable housing 350 in electrical communication with the processor 390. In response to the temperature sensor detecting a conduit temperature above a threshold level, electric fan 360 may be active.

In various embodiments, the cooling air provided by electric fan 360 may travel along cooling path D through the cable housing 350 into the tail cone 122 and exit out the second conduit 234 proximate the drain mast 240 from FIG. 1B. In various embodiments, as described further herein, a tail cone ejector disposed at an aft end of tail cone 122 may be utilized to eject the cooling flow of the cable cooling system, as described further herein.

Figure 3:
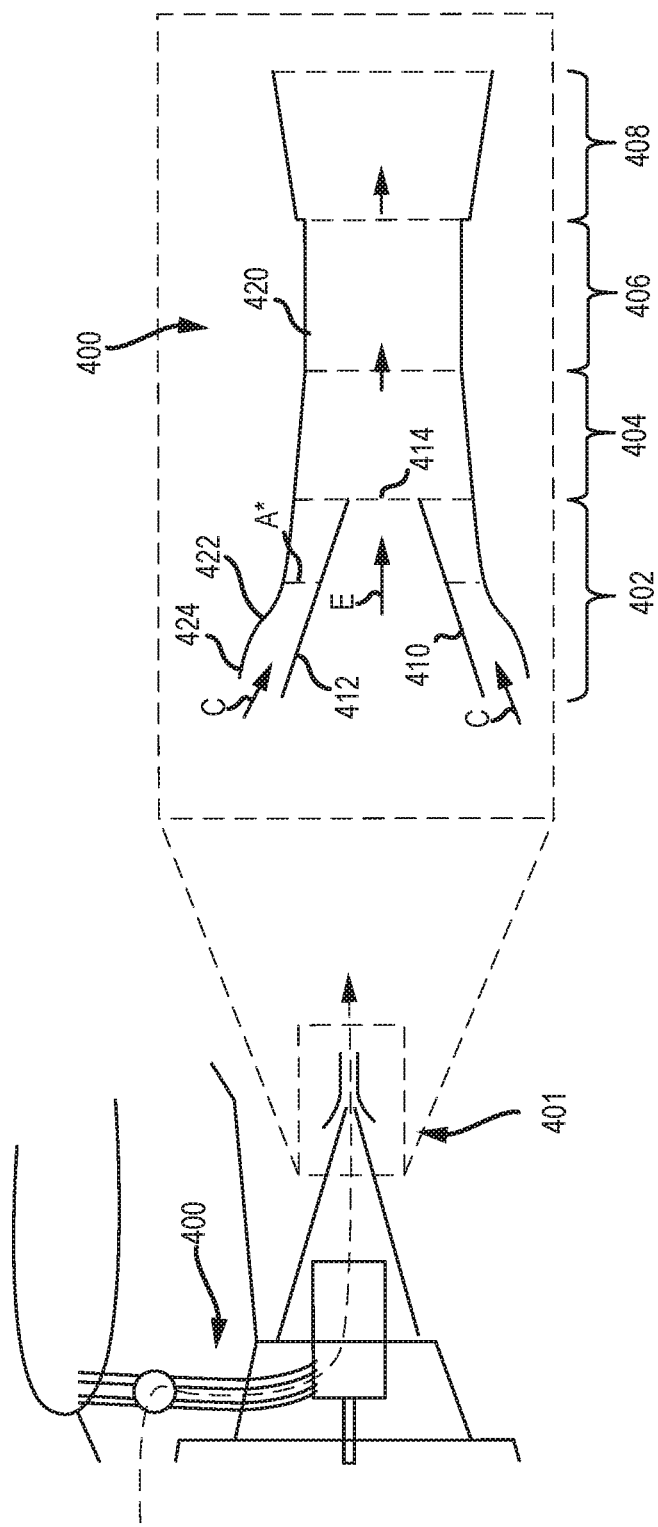
FIG. 3 illustrates a schematic view of an ejector assembly for use in a cooling system of a gas turbine engine, in accordance with various embodiments.

Referring now to FIG. 3, a schematic view of a tail cone ejector assembly 401 for use in a conductive cable cooling system 400, in accordance with various embodiments, is illustrated. In various embodiments, the conductive cable cooling system 400 may be in accordance with cable cooling system 300 with the exception of the exhaust flow path (e.g., flow path D from FIG. 2 relative to flow path E from FIG. 3). Tail cone ejector assembly 401 may include a nozzle section 402, a mixing section 404, a constant area section 406, and a diffuser section 408. In various embodiments, the ejector assembly 401 comprises a tail cone 410 and an ejector body 420. The tail cone 410 may be a part of tail cone 122 from FIGS. 1B and 2. In operation, an entrained flow may travel through a flow path defined by a wall 412 of a tail cone 410 and a primary flow may travel between the wall 412 and a nozzle portion 422 of an ejector body 420. The nozzle portion 422 may be a portion of the ejector body within the nozzle section 402 of the tail cone ejector assembly 401. The wall 412 may further define cooling path D, and the wall 412 and the nozzle portion 422 of the ejector body 420 may further define core-flow path C. Fluid (e.g., air) is driven through core-flow path C as described previously herein, which is configured to entrain cooling flow along cooling flow path E. For example, a drop in pressure of the fluid traveling along core-flow path C caused by an increase in velocity after the flow along core-flow path C is choked at the choke area (e.g., the throat A*) pulls in (e.g., entrains) the cooling air flow through the cooling flow path E. The choke area is a constriction area along core-flow path C and may be a minimum constriction area. By choking the flow at the choke area, the velocity of the air flow traveling along core-flow path C increases aft of the choke area. Although described herein as an ejector assembly with choked flow resulting in a sonic exit velocity, the present disclosure is not limited in this regard. For example, a tail cone ejector assembly 401 may include a non-choked ejector without a choke area (e.g., throat A*) resulting in a subsonic exit velocity of the ejector assembly.

In various embodiments, the electric fan 360 from FIG. 2 may be sized and configured to actively cool the conductive cables 310 after an engine shutdown when an airplane having the gas turbine engine is on the ground. During operation of the gas turbine engine, the passive air flow from bypass flow path B from FIG. 1B may not provide enough pressure to eject air out the tail cone 410 on its own. For example, without the ejector assembly 401, air traveling along cooling flow path E may be subject to reverse.

In various embodiments, the ejector body 420 further comprises a scoop 424 disposed at a forward end of the ejector body 420. The scoop 424 is configured to scoop exhaust flow from the gas-turbine engine into the outer annulus defined by the wall 412 of the tail cone 410 and the ejector body 420 where the exhaust flow acts as the primary air flow of the ejector assembly 401. In various embodiments, the tail cone 410 further comprises a tail cone outlet 414 disposed aft of the scoop 424 of the ejector body 420. The tail cone outlet 414 is also aft of the throat A* of the ejector assembly 401 and adjacent to the mixing section 404 of the ejector assembly.

Figure 4:
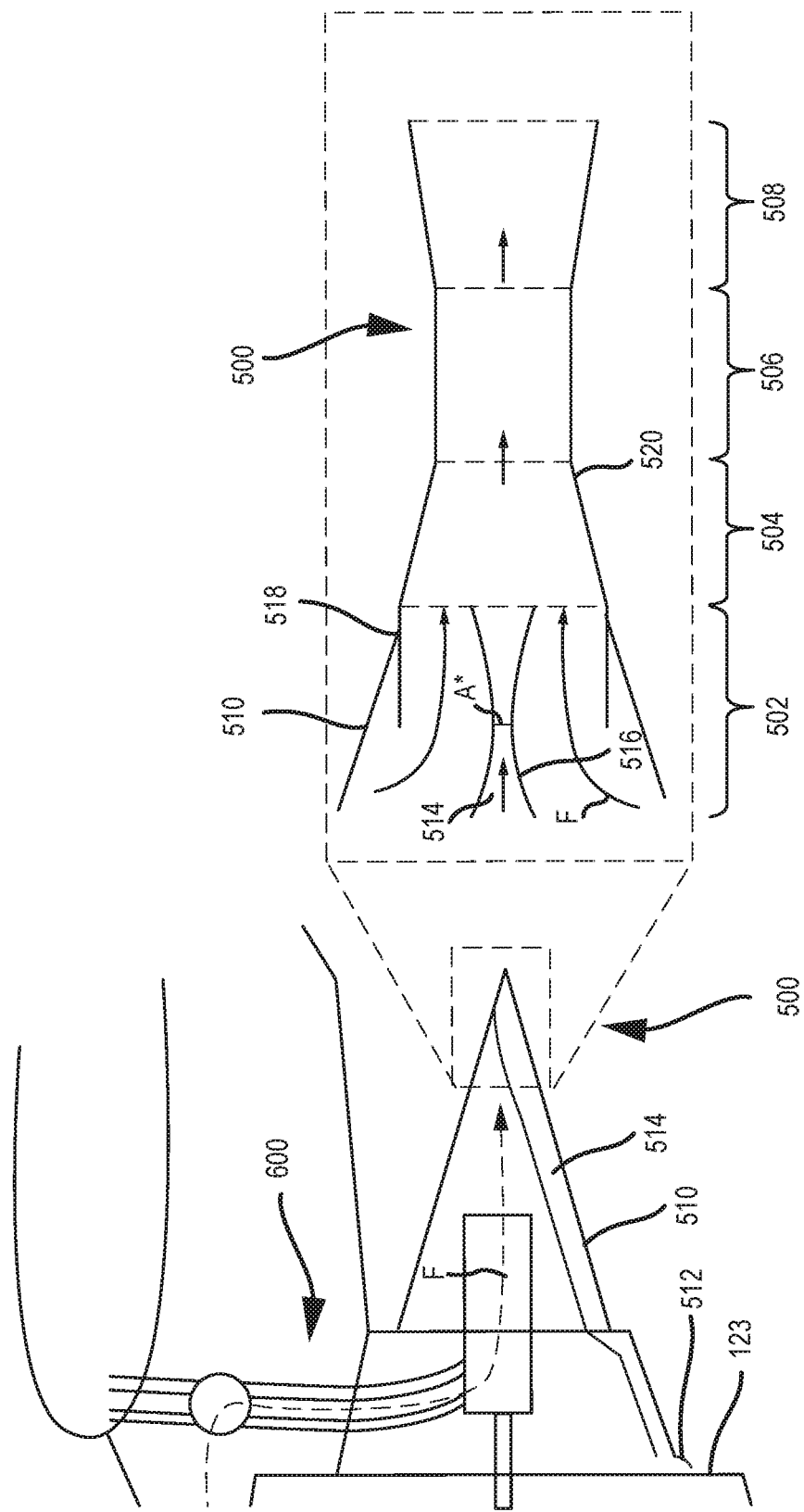
FIG. 4 illustrates a schematic view of an ejector assembly for use in a cooling system of a gas turbine engine, in accordance with various embodiments.

Referring now to FIG. 4, a schematic view of a tail cone ejector assembly 500 for use in a conductive cable cooling system 600, in accordance with various embodiments, is illustrated. In various embodiments, the conductive cable cooling system 600 is in accordance with the cable cooling system 300 except as further described herein. In various embodiments, the tail cone 510 comprises a scoop 512 proximate primary nozzle 123. In this regard, the scoop 512 may be configured to direct a portion of exhaust flow from core flow path C from FIG. 1B internal to the tail cone 510 along a channel 514.

In various embodiments, the channel 514 is in fluid communication with an ejector body 520 of the ejector assembly 500. For example, the channel 514 may direct exhaust air from core flow path C through the choke area (e.g., throat A*), and entrain cooling flow traveling along cooling flow path F. In various embodiments, the cooling flow path F may be radially outward from the channel 514. Similar to ejector assembly 401 from FIG. 3, ejector assembly 500 comprises a nozzle section 502, a mixing section 504, a constant area section 506, and a diffuser section 508. The nozzle section 502 includes a nozzle portion 516 of the ejector assembly 500. In various embodiments, the cooling flow path E is disposed between the nozzle portion 516 and the ejector body 520. In various embodiments, the cooling flow path E is the secondary flow path, and the channel 514 defines the primary flow path. In various embodiments, an ejector assembly in accordance with ejector assembly 500 may be more complicated from a manufacturing standpoint for a tail cone ejector relative to an ejector assembly in accordance with the ejector assembly 401. However, an ejector assembly in accordance with ejector assembly 500 may be slightly more efficient relative to an ejector assembly in accordance with ejector assembly 401 from FIG. 3.

In various embodiments, the ejector body 520 may be coupled to the tail cone 510 proximate a tail cone outlet 518. In various embodiments, the channel 514 may be a fluid conduit disposed within the tail cone 510. In various embodiments, the ejector body 520 and the tail cone 510 may be a monolithic component. In various embodiments, the ejector body 520 and the tail cone may be distinct components.

Figure 5:
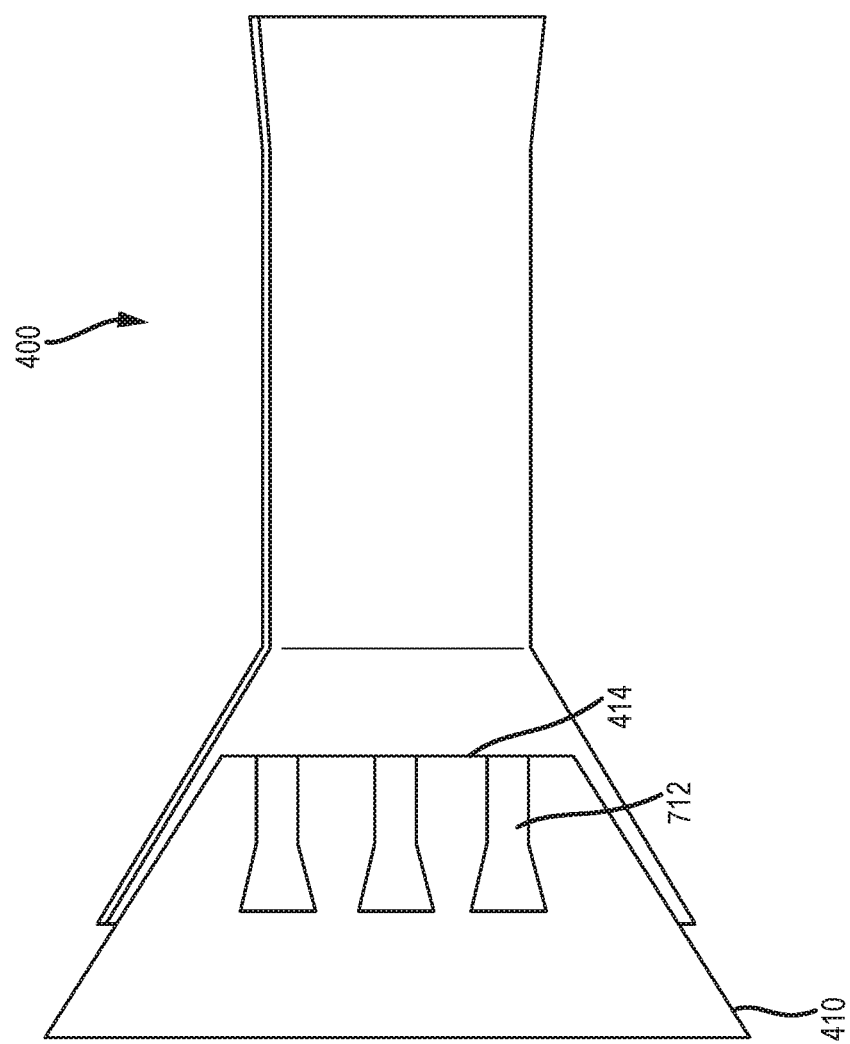
FIG. 5 illustrates a schematic view of an ejector assembly for use in a cooling system of a gas turbine engine, in accordance with various embodiments.

Referring now to FIG. 5, the tail cone ejector assembly 401 in accordance with various embodiments, is illustrated. In various embodiments, the ejector assembly 401 further comprises a motive fluid inlet scoop 712. Although illustrated as comprising three motive fluid inlet scoops, the ejector assembly 401 is not limited in this regard. For example, the ejector assembly 401 may include any number of motive fluid inlet scoops (e.g., one single inlet scoop that sweeps a circumference of less than 360 degrees that is non-axisymmetric, a plurality of motive inlet scoops disposed symmetrically proximate the tail cone outlet 414 of the tail cone 410, or a plurality of asymmetric motive inlet scoops disposed proximate the tail cone outlet 414). In various embodiments, the motive fluid inlet scoop 712 may provide a lip height that is larger to avoid clogging of the ejector assembly 401.

Figure 6:
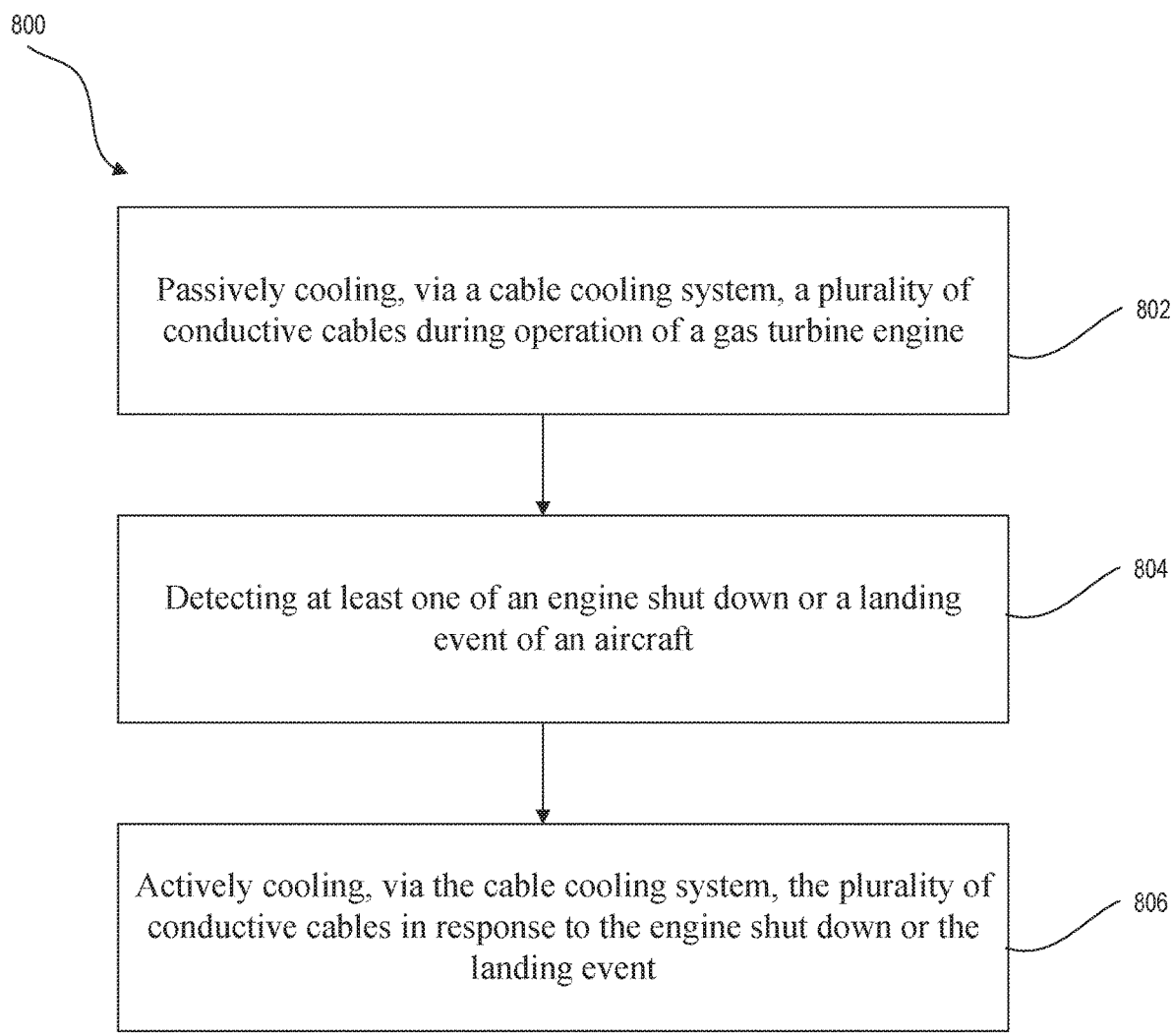
FIG. 6 illustrates a method of cooling a plurality of cables in electrical communication with an electric machine, in accordance with various embodiments.

Referring now to FIG. 6, a method of cooling a plurality of conductive cables in electrical communication with an electric machine in a tail cone of a gas turbine engine is illustrated, in accordance with various embodiments. The method 800 comprises passively cooling, via a cable cooling system, a plurality of conductive cables during operation of a gas turbine engine (step 802). The plurality of cables may be in electrical communication with an electric machine disposed in a tail cone of the gas turbine engine. In various embodiments, passively cooling the plurality of conductive cables may comprise diverting a bypass air flow through an inlet of a conduit. The conduit may be in fluid communication with a cable housing.

In various embodiments, the method 800 may further comprise detecting, via the cable cooling system, at least one of an engine shut down or a landing event of an aircraft (step 804). The engine shut down or the landing event may be detected via the control system as disclosed previously herein.

In various embodiments, the method 800 may further comprise actively cooling, via the cable cooling system, the plurality of conductive cables in response to detecting the engine shutdown or the landing event (step 806). In various embodiments, actively cooling the plurality of conductive cables may further comprise activating an electric fan disposed in the conduit. In various embodiments, detecting a high cable temperature (e.g., via the second sensor 380 from FIG. 2) may trigger the active cooling of step 806.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosures. The scope of the disclosures is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A cooling system for a gas turbine engine, the cooling system comprising:
    an electric machine;
    a first conduit including a cable housing and an inlet;
    a plurality of conductive cables extending from a point proximal to the electric machine, the plurality of conductive cables disposed at least partially in the cable housing;
    an electric fan disposed in the first conduit between the inlet and the electric machine, the electric fan configured to actively cool the plurality of conductive cables by flowing air through the first conduit, the inlet of the first conduit disposed aft of a fan of the gas turbine engine and on an inner surface of an outer wall of a bypass duct; and
    a bypass air flow path of the gas turbine engine, the bypass air flow path in fluid communication with an internal cavity of the first conduit, wherein:
        the electric fan is configured to actively cool the plurality of conductive cables after an engine shutdown of the gas turbine engine, and
        the cooling system is configured to passively flow air through the inlet to cool the plurality of conductive cables during operation of the gas turbine engine.

2. The cooling system of claim 1, further comprising a second conduit in fluid communication with the first conduit, the second conduit configured to direct an exhaust cooling flow forward of the electric machine.

3. The cooling system of claim 2, further comprising a tail cone defining a tail cone cavity, the electric machine disposed in the tail cone.

4. The cooling system of claim 3, wherein the second conduit extends from the tail cone to a drain mast of the gas turbine engine, the drain mast including a plurality of drainage tubes.

5. The cooling system of claim 1, further comprising a temperature sensor, wherein the electric fan is configured to at least one of activate or increase a rotational speed in response to a measured temperature from the temperature sensor exceeding a predetermined temperature threshold.

6. The cooling system of claim 1, further comprising a tail cone ejector assembly, the tail cone ejector assembly configured to entrain an exhaust cooling flow through an outlet of a tail cone.

7. A cable cooling system of a gas turbine engine, the cable cooling system comprising:
    a control system;
    a first sensor configured to communicate with the control system;
    an electric fan configured to communicate with the control system; and
    a non-transitory computer readable storage medium in electronic communication with the control system, the non-transitory computer readable storage medium having instructions stored thereon that, in response to execution by the control system cause the control system to perform operations comprising:
    detecting, by the control system, a shutdown of the gas turbine engine;
    activating, by the control system, the electric fan to actively flow air through a conduit having a plurality of conductive cables disposed therein, the conduit defining an inlet in an inner surface of an outer wall of a bypass duct; and
    in response to the activating the electric fan, pulling an airflow from a bypass airflow path through the inlet of the conduit, wherein the inlet is configured to receive passive airflow during operation of the gas turbine engine.

8. The cable cooling system of claim 7, wherein:

the first sensor comprises a temperature sensor disposed in a cable housing, and the plurality of conductive cables are housed in the cable housing.

9. The cable cooling system of claim 8, wherein the operations further comprise activating, by the control system, the electric fan in response to a measured temperature from the temperature sensor exceeding a predetermined threshold.

10. The cable cooling system of claim 8, further comprising a second sensor, wherein the operations further comprise determining, by the control system, an engine shutdown of the gas turbine engine in response to a measurement from the second sensor.

11. The cable cooling system of claim 10, wherein the second sensor is a weight-on-wheels sensor.

12. The cable cooling system of claim 7, wherein the operations further comprise determining, by the control system, an engine shutdown of the gas turbine engine in response to a measurement from the first sensor.

13. The cable cooling system of claim 12, wherein the first sensor comprises a weight-on-wheels sensor.

14. A method of cooling a plurality of conductive cables in electrical communication with an electric machine in a tail cone of a gas turbine engine, the method comprising:

passively cooling, via a cable cooling system and through a conduit of the cable cooling system, the plurality of conductive cables during operation of the gas turbine engine via a bypass airflow received from an inlet of the conduit, the inlet disposed in an inner surface of an outer wall of a bypass duct; and actively cooling, via the cable cooling system and by an electric fan disposed in the conduit, the plurality of conductive cables by pulling an airflow from a bypass airflow path through the inlet of the conduit in response to at least one of a temperature in a cable housing exceeding a predetermined threshold, an engine shutdown of the gas turbine engine, or a landing event of an aircraft, the electric fan disposed in the conduit.

15. The method of claim 14, further comprising exhausting a cooling airflow from the cable cooling system forward of the electric machine.

16. The method of claim 14, further comprising exhausting a cooling airflow from the cable cooling system through a tail cone ejector assembly.

17. The method of claim 14, wherein actively cooling the plurality of conductive cables further comprises activating the electric fan in response to the engine shutdown of the gas turbine engine.

18. The method of claim 14, further comprising detecting, via the cable cooling system, at least one of the engine shutdown of the gas turbine engine or the landing event of the aircraft.

* * * * *